March 21, 1967 G. WINSTEL ET AL 3,310,442

METHOD OF PRODUCING SEMICONDUCTORS BY DIFFUSION

Filed Oct. 16, 1964

United States Patent Office 3,310,442

Patented Mar. 21, 1967

3,310,442
METHOD OF PRODUCING SEMICONDUCTORS BY DIFFUSION

Günter Winstel and Franz Wassermann, Munich, Germany, assignors to Siemens & Halske Aktiengesellschaft, Berlin and Munich, Germany Filed Oct. 16, 1964, Ser. No. 405,332
14 Claims. (Cl. 148—187)

Figure 1:
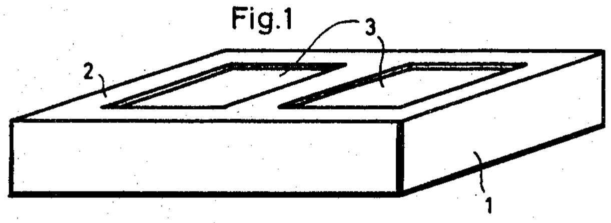

Our invention relates to a method of providing semiconductor bodies for electronic and other purposes with junctions of a defined size between regions of respectively different conductance types and/or different conductivity, according to which dopant substances are diffused into the semiconductor body with the aid of a masking technique.

Masking by means of an oxide coating is particularly advantageous. In this method, the surface of the semiconductor body is given an oxide coating before commencing the diffusion process. When using silicon, for example, the semiconductor is subjected to oxidizing heat treatment in the presence of steam. The resulting oxide coating is then removed by etching those localities at which doping substance is to be diffused into the semiconductor body. For this purpose, the oxide coating is covered with varnish or wax which prevents the etching medium from attacking the other areas of the oxide coating. During the subsequent diffusion process, the doping substances diffuse into the semiconductor body at the exposed areas. In this method, the oxide coating serves not only to entirely or partly prevent the dopant from penetrating into the semiconductor substances underneath, but also constitutes a protective envelope which prevents ingress of impurities from the environment into the semiconductor body.

This method, however, is troublesome when very small but accurately defined areas of the semiconductor surface are to be exposed by etching therefrom the oxide coating with the aid of a masking technique, such as photolithography. It is particularly difficult, after coating the entire surface, to eliminate the coating only from small areas of precisely defined sizes. On the other hand, it is much easier to proceed in the converse manner, namely to deposit an additional substance upon a desired small and accurately dimensioned area. This can be done, for example, by known vapor deposition techniques.

It is an object of our invention to utilize the advantage of the latter method, namely the ease and precision with which a material can be deposited, in the production of semiconductor components requiring a diffusion of dopant material into oxide-coated semiconductor crystals for producing therein an accurately limited surface region of a modified conductance magnitude or type.

Another, more specific object of the invention is to afford a convenient diffusion doping of oxide-coated semiconductors in very small surface regions with extreme precision as to size and shape of the area, without the use of photolithographic or photoresist methods.

Still another object of the invention is to permit performing a method of the above-mentioned type, without the use of a hydrofluoric acid etching media since such acid is usually greatly contaminated, thereby causing faulty doping.

According to the invention, we deposit upon the oxide-coated semiconductor crystal, in the areas where the diffusion is to be subsequently performed, at least an additional substance capable of reactions with the oxide coating to form a gaseous compound at a temperature less than, or substantially equal to, the diffusion temperature. The deposited addition substance is applied in a quantity sufficient to convert substantially and eliminate all of the oxide in the deposition area, that is in a stoichiometric quantity.

One way of performing the method of the invention is to employ as addition a material, which is completely dissociated into gaseous constituents at the reaction temperature, one of these constituents reacting with the oxide coating by forming a gaseous compound. Such an addition substance, for example, is ammonium fluoride.

According to another way of performing the method of the invention, an addition material is used which, when reacting with the oxide coating, particularly silicon dioxide, is only partially dissociated into gaseous constituents. An example of such addition material is sodium fluoride. The sodium oxide resulting from the reaction $$SiO_2+2Na_2F_2 \rightarrow SiF_4(gas)+2Na_2O$$

can subsequently be rinsed off, for example with water.

The addition material may be such that it does not cause any doping of the semiconductor material. However, if desired, the addition material may also serve to simultaneously dope the semiconductor material. This is the case, for example, when employing lithium fluoride as addition material on the coating of $SiO_2$ on silicon. The addition substance may also serve to produce recombination centers in the semiconductor crystal or for gettering any heavy-metal ions contained in the crystal.

According to another way of performing the method of the invention, an addition substance for reacting with the oxide coating and removing the coating from a defined area, is employed in conjunction with an additional substance which is to serve as doping material, or for producing recombination centers, or as a gettering agent.

When the coating on the semiconductor crystal consists of $SiO_2$, the addition material deposited on those defined areas where the coating is to be removed, consist preferably of fluorides. Particularly suitable are the alkali fluorides, such as lithium flouride, sodium fluoride or ammonium fluoride. Also applicable are fluorides of elements from the third group of the periodic system, for example aluminum fluoride. Mixtures of fluorides from several groups of the periodic system are likewise suitable, for example sodium fluoride and aluminum fluoride in a mixing ratio corresponding to the composition of cryolite fluoro compounds are applicable in lieu of the fluorides, for example, alkali fluoro- or ammonium fluorotitanate, -ferrite, -niccolate, or the like.

The above-mentioned addition materials are deposited upon the semiconductor surface preferably with the aid of a masking technique so that the deposition is limited to the area of the oxide coating where subsequently the doping substance for modifying the conductance properties as regards conductivity or conductance type is to be effective. The deposition of the reaction agent may also be effected by cathode sputtering, particularly in conjunction with a masking technique which exposes only the deposition areas of the oxide coating. Another way of deposition is to apply a solution of the addition substance upon the proper areas of the oxide coating.

The oxide coating on the semiconductor crystal may consist of an oxide of the semiconductor material itself. This oxide coating may be produced for example, by anodic or oxidation. This method is particularly suitable when using silicon as semiconductor material and providing it with a coating of $SiO_2$. When the semiconductor body consists of other materials, for example germanium or $A^{III}B^{V}$ compounds, it is preferable to cover the semiconductor surface with a coating consisting of an oxide of a different material. It is particularly preferable to do this by vapor deposition of the oxide. Thus, it is preferable to coat germanium or $A^{III}B^{V}$ compounds by vapor deposition with SiO which is subsequently or during the vapor deposition process further oxidized, in known manner, to form a coating of $SiO_2$.

For a number of addition materials, particularly those, which at the reaction temperature, only partially dissociate into gaseous constituents, it is advisable to perform the reaction between the addition substance and oxide in an atmosphere which acts as a catalyst upon the formation of a gaseous compound and prevents the formation of undesired compounds of the non-volatile reaction products. Suitable for this purpose, for example, is a $CO_2$ atmosphere. For example, it is possible in this manner, when using sodium fluoride as addition material, to convert the sodium oxide, evolving during the reaction, into sodium carbonate. The sodium carbonate then forms at the diffusion temperature upon the upper melt on the semiconductor surface and, is considerably less aggressive than the sodium oxide evolving during reaction in an oxidizing atmosphere.

The method of the invention is also suitable for multiple diffusion. Such a method is performed in the same manner as the conventional oxide masking process in which the semiconductor surface is exposed by etching the oxide coating away in a liquid phase.

A particular advantage of this method is the fact that the surface of the semiconductor crystal can be laid bare without necessitating the use of a hydrofluoric acid etchant which often is greatly contaminated. The fluorides of fluoro compounds employed as etching agents can be produced in a much higher degree of purity, because they are available as crystallized compounds and can be purified in accordance with known crystal purifying methods. Furthermore, these compounds have the advantage of being much less aggressive than hydrofluoric acid so that a contamination by the vessel materials is largely obviated as well as being safer for personnel to handle.

Another advantage is the fact that it is considerably simpler to perform a vapor deposition upon very small defined areas, than excluding such areas by etching when performing a vapor deposition method. Another considerable advantage is that our method permits eliminating the use of photolithographic masking methods and the like.

The invention will be further described with reference to an embodiment illustrated by way of example on the accompanying drawing and also with reference to specific examples described hereinafter in conjunction with the illustrated embodiment.

Figure 2:
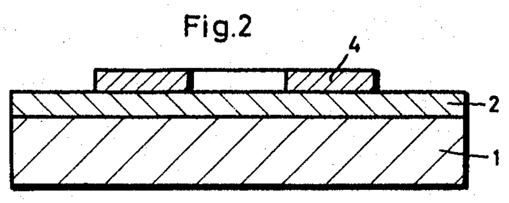
Figure 3:
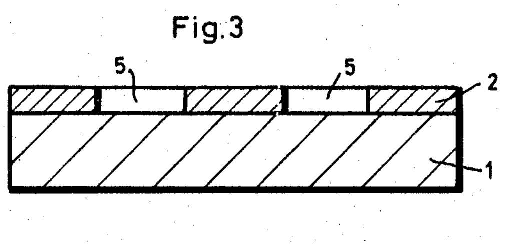
Figure 4:
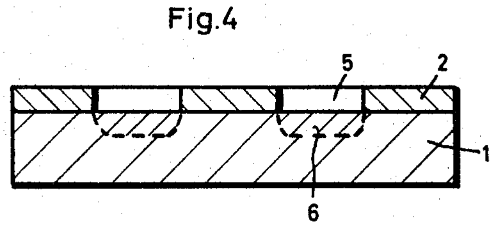

FIG. 1 of the drawing shows schematically and in perspective an oxide coated semiconductor crystal having the coating removed in accurately contoured areas where subsequently a diffusion process is to be performed; and FIGS. 2, 3 and 4 are cross-sectional views of the same semiconductor body during three different stages of the production process.

According to FIG. 1, a semiconductor crystal 1 is provided with an oxide coating 2. The oxide coating is removed in rectangular areas 3 so that the semiconductor surface is exposed in these areas for the diffusion of doping material into the crystal. The shape and size of these areas 3 can be accurately determined and maintained by employing the method according to the invention.

As indicated in FIGS. 2 and 3, the areas 3 are produced as follows. First an oxide coating 2 is produced on the semiconductor crystal 1, covering the entire crystal surface. A quantity of additional substance 4 is then placed on top of the coating, namely in the particular areas where the diffusion of material is to be subsequently effected. As explained, the material 4 is reactionable with the oxide by formation of a gaseous compound, so that the reaction, effected at elevated temperature, results in producing window openings 5 in the oxide coating 2, this being shown in FIG. 3.

During the subsequent diffusion, for example of doping substances, through the window openings 5, the regions 6 shown in FIG. 4 assume the desired changed resistance conductivity characteristics.

The following example relates to a process in which, for exposing defined areas of the semiconductor surface, there is used an addition material which at the reaction temperature is completely dissociated into gaseous constituents.

The semiconductor body consisting of monocrystalline n-type silicon is thermally oxidized and thus coated with $SiO_2$. The thickness of the $SiO_2$ coating is approximately $1\mu$. Thereafter, a layer of ammonium fluoride, approximately $1\mu$ thick is vaporized onto the areas at which subsequently the doping substances are to be diffused into the crystal. The quantity of the ammonium fluoride employed is determined by the quantity of the silicon dioxide to be dissolved. At the reaction temperature, the ammonium fluoride is dissociated in $NH_3$ and $H_2F_2$. The hydrofluoric acid reacts with $SiO_2$ and forms $SiF_4$. Gaseous $SiF_4$ and the $NH_3$ evolving from the dissociation of the ammonium fluoride pass into the atmosphere surrounding the crystal. Thus a window opening is produced in the oxide layer having exactly the shape of the area in which the diffusion is to be performed. In the diffusion process which follows, acceptor materials are diffused into the semiconductor body. The dopant concentration is determined into a conventional manner by the duration of the diffusion process and the concentration of the doping substance being used.

According to another example, the addition substance used only partially dissociates into gaseous constituents. The residual non-volatile constituent, however, does not cause doping of the semiconductor material. In this example, an n-semiconductor body of silicon, coated with $SiO_2$ as described above, is provided at the prescribed diffusion areas with a corresponding quantity of sodium fluoride. This is preferably done with the aid of a masking technique. In this manner of operation it is advisable to perform the reaction of the addition material with the oxide, in a carbon dioxide atmosphere to prevent the production of the undesired sodium oxide. The sodium evolving from the dissociation of the sodium fluoride combines with the carbon dioxide and forms at the diffusion temperature, a melt of sodium carbonate, on the semiconductor surface. The liberated $H_2F_2$ reacts in the same manner as described in the foregoing example, with the $SiO_2$. The diffusion of doping substances is likewise performed in the manner already described.

According to a further example, the addition material simultaneously serves as a doping substance. A semiconductor body of n-type silicon is provided in the described manner with a coating of $SiO_2$ having a thickness of approximately $1\mu$. Then the areas provided for subsequent diffusion of material are covered with a quantity of lithium fluoride, which is vapor deposited with the aid of a mask. At the reaction temperature, the fluoride dissociates and the resulting hydrogen fluoride reacts with $SiO_2$ and forms gaseous $SiF_4$. The portion of the remaining lithium diffuses into the semiconductor body and causes doping of the diffusion region.

According to another example, in which the addition material employed also serves as doping substance, a mixture of aluminum fluoride and sodium fluoride is vaporized with the aid of a mask upon the $SiO_2$-coated semiconductor body. The mixing ratio corresponds to the composition of cryolite. At the reaction temperature, the evolving sodium-aluminum-fluoride is dissociated and evolves gaseous $H_2F_2$ which reacts with the silicon dioxide under formation of gaseous $SiF_4$ in the same manner as in the examples described above. Residual aluminum diffuses into the exposed regions of the semiconductor body and causes doping of the diffusion regions. In this manner of proceeding, too, it is advisable to operate in a $CO_2$ atmosphere to prevent the formation of sodium oxide.

The following example relates to the use of addition material which simultaneously serves for producing recombination centers in the semiconductor body. Employed as addition material on an $SiO_2$ coating of a semiconductor crystal is a fluoro compound of a heavy metal. Particularly suitable are alkalihexafluoroniccolate and alkalipentafluoroferrate. The hydrogen fluoride liberated at the reaction temperature removes the $SiO_2$ coating in the regions covered by the addition material, and nickel or iron diffuses into the semiconductor crystal beneath the exposed areas.

The method is performed in the same manner when employing as addition material, a substance suitable for gettering of heavy metal ions contained in the semiconductor crystal. Suitable addition materials for this purpose are fluoro compounds of tetra-valent lead.

When germanium or an $A^{III}B^{V}$ compound or an $A^{II}B^{VI}$ compound is employed in lieu of silicon, it is necessary to coat the semiconductor body with an oxide of different material. As mentioned, it has been found preferable to vaporize SiO onto the semiconductor surface and to further process the deposition in an oxidizing atmosphere to obtain a coating of $SiO_2$. The exposing of defined window areas of the semi-conductor surface is thereafter affected in the manner described above for silicon.

The method according to the invention is applicable to the production of virtually all semiconductor components such as transistors, rectifiers, as well as to solid-state microcircuits and other combinations.

The use of lithium fluoride is particularly suitable for producing so-called memorizing components.

We claim:

1. A method for producing semiconductor components having limited regions of respectively different conductances produced by diffusing doping material into silicon dioxide coated semiconductor crystals, which comprises depositing upon selected portions of the dioxide coating, a stoichiometric quantity of at least one addition material reactionable with the dioxide coating to form a gaseous compound at a temperature less than the diffusion temperature, heating said crystal to permit said addition substance to react with said dioxide coating, and thereafter diffusing through the resulting openings of said coating a doping material into the crystals at the diffusion temperature.

2. A method for producing semiconductor components having limited regions of respectively different conductances produced by diffusing doping material into silicon dioxide coated semiconductor crystals, which comprises depositing upon the dioxide coating in the areas subsequently subjected to diffusion, at least one addition material reactionable with the dioxide coating, to form a gaseous compound at a temperature not higher than the diffusion temperature, the addition substance having a quantity sufficient to substantially fully convert the oxide in said areas to the gaseous compound and containing a non-volatile constituent, heating said crystal to permit said addition substance to react with said dioxide coating, and thereafter diffusing through the resulting openings of said coating a doping material into the crystals at the diffusion temperature.

3. A method for producing semiconductor components having limited regions of respectively different conductances produced by diffusing doping material into silicon dioxide coated semiconductor crystals, which comprises depositing upon the dioxide coating in the areas subsequently subjected to diffusions, at least one addition material reactional with the dioxide coating, to form a gaseous compound at a temperature not higher than the diffusion temperature, the addition substance having a quantity sufficient to substantially fully convert the oxide in said areas to the gaseous compound, and containing a non-volatile constituent which simultaneously dopes the semiconductor crystal, heating said crystal to permit said addition substance to react with said dioxide coating, and thereafter diffusing through the resulting openings of said coating said non-volatile constituent into the crystals at the diffusion temperature.

4. A method for producing semiconductor components having limited regions of respectively different conductances produced by diffusing doping material into silicon dioxide coated semiconductor crystals, which comprises depositing upon the dioxide coating, in the areas subsequently subjected to diffusion, at least one addition material reactionable with the dioxide coating to form a gaseous compound at a temperature not higher than the diffusion temperature, the addition substance having a quantity sufficient to substantially fully convert the oxide in said areas to the gaseous compound, and containing a non-volatile constituent which simultaneously produces recombination centers in the semiconductor crystal, and thereafter diffusing through the resulting openings of said coating a doping material into the crystals at the diffusion temperature.

5. A method for producing semiconductor components having limited regions of respectively different conductances produced by diffusing doping material into silicon dioxide coated semiconductor crystals, which comprises depositing upon the dioxide coating, in the areas subsequently subjected to diffusions, at least one addition material reactionable with the dioxide coating, to form a gaseous compound at a temperature not higher than the diffusion temperature, the addition substance having a quantity sufficient to substantially fully convert the oxide in said areas to the gaseous compound and containing a non-volatile constituent which simultaneously acts as a gettering for any heavy metal ions present in the semiconductor crystal, heating said crystal to permit said addition substance to react with said dioxide coating, and thereafter diffusing through the resulting openings of said coating a doping material into the crystals at the diffusion temperature.

6. A method for producing semiconductor components having limited regions of respectively different conductances produced by diffusing doping material into silicon dioxide coated semiconductor crystals, which comprises depositing upon selected portions of the dioxide coating, a stoichiometric quantity of a fluoride reactionable with the dioxide coating to form a gaseous compound at a temperature less than the diffusion temperature, heating said crystal to permit said addition substance to react with said dioxide coating, and thereafter diffusing through the resulting openings of said coating a doping material into the crystals at the diffusion temperature.

7. A method for producing semiconductor components having limited regions of respectively different conductances produced by diffusing doping material into silicon dioxide coated semiconductor crystals, which comprises depositing upon the dioxide coating, in the areas subsequently subject to diffusion, a stoichiometric quantity of an alkali fluoride, selected from the group consisting of lithium fluoride, sodium fluoride and ammonium fluoride reactionable with the dioxide coating to form a gaseous compound at a temperature less than the diffusion temperature, hetaing said crystal to permit said addition substance to react with said dioxide coating, heating said crystal to permit said addition substance to react with said dioxide coating, and thereafter diffusing through the resulting openings of said coating a doping material into the crystals at the diffusion temperature.

8. A method for producing semiconductor components having limited regions of respectively different conductances produced by diffusing doping material into silicon dioxide coated semiconductor crystals, which comprises depositing upon the dioxide coating, in the area subsequently subject to diffusion, a stoichiometric quantity of aluminum fluoride reactionable with the dioxide coating to form a gaseous compound at a temperature less than the diffusion temperature, heating said crystal to permit said addition substance to react with said dioxide coating, and thereafter diffusing through the resulting openings of said coating a doping material into the crystals at the diffusion temperature.

9. A method for producing semiconductor components having limited regions of respectively different conductances produced by diffusing doping material into silicon dioxide coated semiconductor crystals, which comprises depositing upon selected portions of the dioxide coating, a stoichiometric quantity of a mixture of aluminum fluoride and sodium fluoride reactionable with the dioxide coating to form a gaseous compound at a temperature less than the diffusion temperature, heating said crystal to permit said addition substance to react with said dioxide coating, and thereafter diffusing through the resulting openings of said coating a doping material into the crystals at the diffusion temperature.

10. A method for producing semiconductor components having limited regions of respectively different conductances produced by diffusing doping material into silicon dioxide coated semiconductor crystals, which comprises depositing upon the dioxide coating, in the areas subsequently subject to diffusion, a stoichiometric quantity of a fluoro compound selected from the group consisting of alkali-fluoroniccolates and alkalifluoroferrates reactionable with the dioxide coating to form a gaseous compound at a temperature less than the diffusion temperature, heating said crystal to permit said addition substance to react with said dioxide coating, and thereafter diffusing through the resulting openings of said coating a doping material into the crystals at the diffusion temperature.

11. A method for producing semiconductor components having limited regions of respectively different conductances produced by diffusing doping material into oxide-coated semiconductor crystals, which comprises depositing by vaporization upon the oxide coating, in the areas to be subsequently subjected to diffusion, at least one addition material reactionable with the oxide compound to form a gaseous compound at a temperature not higher than the diffusion temperature, the addition substance having a quantity sufficient to substantially fully convert the oxide in said areas to the gaseous compound, and thereafter diffusing through the resulting openings of said coating a doping material into the crystals at the diffusion temperature.

12. A method for producing semiconductor components having limited regions of respectively different conductances produced by diffusing doping material into oxide-coated semiconductor crystals, which comprises depositing by cathode sputtering upon the oxide coating, in the areas to be subsequently subjected to diffusion, at least one addition material reactionable with the oxide compound to form a gaseous compound at a temperature not higher than the diffusion temperature, the addition substance having a quantity sufficient to substantially fully convert the oxide in said areas to the gaseous compound, heating said crystal to permit said addition substance to react with said dioxide coating, and thereafter diffusing through the resulting openings of said coating a doping material into the crystals at the diffusion temperature.

13. A method for producing semiconductor components having limited regions of respectively different conductances produced by diffusing doping material into oxide-coated semiconductor crystals, which comprises depositing a solution upon the oxide coating, in the areas to be subsequently subjected to diffusion, of at least one addition material reactionable with the oxide compound to form a gaseous compound at a temperature not higher than the diffusion temperature, the addition substance having a quantity sufficient to substantially fully convert the oxide in said areas to the gaseous compound, heating said crystal to permit said addition substance to react with said dioxide coating, and thereafter diffusing through the resulting openings of said coating a doping material into the crystals at the diffusion temperature.

14. A method for producing semiconductor components having limited regions of respectively different conductances produced by diffusing doping material into silicon dioxide coated semiconductor crystals, which comprises depositing upon selected portions of the dioxide coatings, a stoichiometric quantity of at least one addition material reactionable with the dioxide coating to form a gaseous compound at a temperature less than the diffusion temperature, heating in a $CO_2$ atmosphere said crystal to permit said addition substance to react with said dioxide coating, and thereafter diffusing through the resulting openings of said coating a doping material into the crystals at the diffusion temperature.

References Cited by the Examiner

UNITED STATES PATENTS

| | | | |
|---|---|---|---|
| 3,041,258 | 6/1962 | Sikina | 156—12 |
| 3,064,167 | 11/1962 | Hoerni | 148—187 |
| 3,122,817 | 3/1964 | Ardrus | 148—187 |
| 3,212,943 | 10/1965 | Freck et al. | 148—188 |
| 3,215,570 | 11/1965 | Andrews | 148—189 |

HYLAND BIZOT, *Primary Examiner.*